(12) United States Patent
Ishida

(10) Patent No.: US 7,182,811 B2
(45) Date of Patent: Feb. 27, 2007

(54) SEMICONDUCTOR LIGHT EMITTING DEVICE AND METHOD FOR PRODUCING THE SAME

(75) Inventor: Masaya Ishida, Kashiba (JP)

(73) Assignee: Sharp Kabushiki Kaisha, Osaka (JP)

( * ) Notice: Subject to any disclaimer, the term of this patent is extended or adjusted under 35 U.S.C. 154(b) by 255 days.

(21) Appl. No.: 10/785,554

(22) Filed: Feb. 23, 2004

(65) Prior Publication Data

US 2004/0166599 A1    Aug. 26, 2004

Related U.S. Application Data

(62) Division of application No. 09/780,295, filed on Feb. 9, 2001, now Pat. No. 6,806,507.

(30) Foreign Application Priority Data

Feb. 10, 2000 (JP) ............... 2000-032844
Feb. 5, 2001 (JP) ............... 2001-028914

(51) Int. Cl.
*C30B 25/04* (2006.01)

(52) U.S. Cl. .................. 117/91; 117/89; 117/92; 117/104

(58) Field of Classification Search ............ 117/89, 117/91, 92, 104
See application file for complete search history.

(56) References Cited

U.S. PATENT DOCUMENTS

| | | | |
|---|---|---|---|
| 4,862,471 A * | 8/1989 | Pankove | 372/45.01 |
| 5,932,896 A | 8/1999 | Sugiura et al. | |
| 6,117,700 A * | 9/2000 | Orita et al. | 438/46 |
| 6,365,923 B1 | 4/2002 | Kamei | |
| 6,580,099 B2 * | 6/2003 | Nakamura et al. | 257/103 |
| 6,900,465 B2 * | 5/2005 | Nakamura et al. | 257/79 |
| 2002/0149024 A1 * | 10/2002 | Kato et al. | 257/79 |

FOREIGN PATENT DOCUMENTS

| | | |
|---|---|---|
| JP | 05-183189 | 7/1993 |
| JP | 08-148718 | 6/1996 |

(Continued)

OTHER PUBLICATIONS

Copy of Office Action Issued on Feb. 5, 2004, in the Japanese counterpart patent application No. 2001-028914, 3 pages.

(Continued)

*Primary Examiner*—Robert Kunemund
(74) *Attorney, Agent, or Firm*—Morrison & Foerster LLP

(57) ABSTRACT

A semiconductor light emitting device comprises: a substrate; an n-type layer provided on the substrate and made of a nitride semiconductor material; a multiple quantum well structure active layer including a plurality of well layers each made of $In_xGa_{(1-x-y)}Al_yN$ ($0 \leq x$, $0 \leq y$, $x+y<1$) and a plurality of barrier layers each made of $In_aGa_{(1-a-t)}Al_tN$ ($0 \leq s$, $0 \leq t$, $s+t<1$), the multiple quantum well structure active layer being provided on the n-type layer; and a p-type layer provided on the multiple quantum well structure active layer and made of a nitride semiconductor material. The p-type layer contains hydrogen, and the hydrogen concentration of the p-type layer is greater than or equal to about $1 \times 10^{16}$ atoms/cm$^3$ and less than or equal to about $1 \times 10^{19}$ atoms/cm$^3$.

2 Claims, 12 Drawing Sheets

FOREIGN PATENT DOCUMENTS

| | | |
|---|---|---|
| JP | 10-154829 A | 6/1998 |
| JP | 10-183357 A | 7/1998 |
| JP | 11-150296 | 6/1999 |
| JP | 2000-031600 | 1/2000 |
| JP | 2000-058919 | 2/2000 |

OTHER PUBLICATIONS

Copy of Office Action mailed on Dec. 22, 2005 for Japanese counterpart patent application No. 2001-028914, 2 pages.

* cited by examiner

SEMICONDUCTOR LIGHT EMITTING DEVICE AND METHOD FOR PRODUCING THE SAME

CROSS-REFERENCE TO RELATED APPLICATIONS

This application is a divisional of U.S. patent application Ser. No. 09/780,295, which has an official filing date of Feb. 9, 2001 now U.S. Pat. No. 6,806,507 which claimed the benefit of Japanese Patent Application No. 2000-032844, filed on Feb. 10, 2000 and Japanese Patent Application No. 2001-028914 filed on Feb. 5, 2001 the contents of each of which are incorporated herein by reference in their entirety.

BACKGROUND OF THE INVENTION

1. Field of the Invention

The present invention relates to a group III-V compound semiconductor light emitting device including nitrogen as a major component, and a method for producing the same.

2. Description of the Related Art

Recently, a high-luminance blue light emitting diode made of a GaN compound semiconductor has been put into practice, and a blue laser diode has been vigorously developed. Group III-V nitride compound semiconductors attract much attention as a material for such light emitting devices.

Conventionally, a nitride semiconductor is grown using hydride vapor phase epitaxy (hereinafter referred to as HVPE), metal organic chemical vapor deposition (hereinafter referred to as MOCVD), molecular beam epitaxy (hereinafter referred to as MBE), or the like.

In the case of group III-V nitride compound semiconductors, it is considerably difficult to produce bulk crystal. It is therefore considerably difficult to obtain a group III-V nitride compound semiconductor substrate on which a group III-V nitride compound semiconductor device is grown. For this reason, a sapphire substrate is typically employed. However, a great level of lattice mismatch occurs between GaN (a group III-V nitride compound semiconductor) and a sapphire substrate, e.g., a defect of $10^9$ to $10^{10}/cm^2$ is present in a GaN film after growth. Such a defect affects the light output or life of a device. To avoid this, GaN is selectively grown to produce a pseudo GaN substrate which is a thick film GaN having a reduced defect. By using such a substrate, a laser device capable of room-temperature continuous-wave operation can be realized.

In addition to defects residual impurities have an adverse effect on a compound semiconductor light emitting device. The characteristics and the life span of an arsenic-based or phosphorus-based compound semiconductor device are greatly affected by oxygen or carbon atoms contained in the device. Therefore, various attempts have been made to remove such residual impurities.

A residual impurity that causes a problem with a group III-V nitride compound semiconductor light emitting device, is hydrogen. When a nitride compound semiconductor device is grown by the above-described methods, organic metals and ammonia are used as materials of the device. Further, hydrogen or hydride (e.g., hydrogen chloride) is used as a carrier gas.

Therefore, residual hydrogen atoms may be present in a growing film of a nitride compound semiconductor. Particularly, when a p-type layer essential for a nitride compound semiconductor light emitting device is grown, hydrogen atoms are likely to remain in the p-type layer. This is because a hydrogen atom is likely to bind to an Mg atom, a Zn atom, or the like which is a dopant for the p-type layer. For example, Appl. Phys. Lett., Vol. 72 (1998), p. 1748, describes that the residual hydrogen concentration of a growth film of a nitrogen compound semiconductor deposited by MOCVD is 2 to $3\times10^{19}$ atoms/cm$^3$, where the Mg concentration is 2 to $3\times10^{19}$ atoms/cm$^3$, and the residual hydrogen concentration increases with an increase in the Mg concentration.

When a hydrogen atom and a p-type dopant such as Mg or Zn bind together, the activity of the dopant is hindered, thereby creating a highly resistant p-type layer.

Japanese Patent No. 2540791 discloses a known technology for preventing a p-type layer from being caused to be highly resistant due to hydrogen atoms. In the technology of Japanese Patent No. 2540791, after growing a group III-V nitride compound semiconductor doped with p-type impurities, annealing is conducted at a temperature of 400° C. or more in an atmosphere not containing hydrogen. The annealing allows hydrogen atoms to be removed from the group III-V nitride compound semiconductor doped with the p-type impurities, thereby obtaining a p-type group III-V nitride compound semiconductor having a low level of resistance.

Hydrogen atoms cannot be sufficiently removed from a p-type layer only by annealing in an atmosphere not containing hydrogen as disclosed in Japanese Patent No. 2540791. Therefore, there is a problem with the technology disclosed in Japanese Patent No. 2540791 in that residual hydrogen atoms in the p-type layer hinder activation of the p-type impurities, and also cause a reduction in the life span of the device. This is because the residual hydrogen atoms are gradually diffused due to the passage of electric current and therefore an active layer is deteriorated. Japanese Patent No. 2540791 does not disclose the atmosphere which is used in the growth of the p-type layer.

Further, when the active layer contains In atoms, Mg and In atoms, as well as hydrogen atoms, are diffused. Especially when the active layer has a thin film quantum well structure, the diffusion of both Mg and In causes considerable deterioration in the active layer.

Furthermore, when the residual hydrogen concentration of an n-type layer is high, the resistance of the n-type layer is also great, thereby deteriorating device characteristics.

SUMMARY OF THE INVENTION

According to one aspect of the present invention, a semiconductor light emitting device comprises: a substrate; an n-type layer provided on the substrate and made of a nitride semiconductor material; a multiple quantum well structure active layer including a plurality of well layers each made of $In_xGa_{(1-x-y)}Al_yN$ ($0\leq x$, $0\leq y$, $x+y<1$) and a plurality of barrier layers each made of $In_aGa_{(1-a-t)}Al_tN$ ($0\leq s$, $0\leq t$, $s+t<1$), the multiple quantum well structure active layer being provided on the n-type layer; and a p-type layer provided on the multiple quantum well structure active layer and made of a nitride semiconductor material. The p-type layer contains hydrogen, and the hydrogen concentration of the p-type layer is greater than or equal to about $1\times10^{16}$ atoms/cm$^3$ and less than or equal to about $1\times10^{19}$ atoms/cm$^3$.

In one embodiment of this invention, the p-type layer contains Mg, and the Mg concentration of the p-type layer is greater than or equal to about $4\times10^{19}$ atoms/cm$^3$ and less than or equal to about $1\times10^{21}$ atoms/cm$^3$.

In one embodiment of this invention, the semiconductor light emitting device further comprises a p-type electrode for applying a voltage via the p-type layer to the multiple quantum well structure active layer. The p-type electrode contains atoms selected from the group consisting of Pd, So, Y, La, Ce, Pr, Nd, Sm, Eu, Tb, Ti, Zr, Hf, V, Nb and Ta.

In one embodiment of this invention, the hydrogen concentration of the n-type layer is less than or equal to $1×10^{17}$ atoms/cm$^3$.

In one embodiment of this invention, the semiconductor light emitting device further comprises a layer including Al, wherein the p-type layer is provided, via the layer including Al, on the multiple quantum well structure active layer.

In one embodiment of this invention, the layer including Al has a thickness of about 5 nm or more.

According to another aspect of the present invention, a method for producing a semiconductor light emitting device, comprises the steps of: growing a nitride semiconductor material on a substrate to form an n-type layer; forming a multiple quantum well structure active layer including a plurality of well layers each made of $In_xGa_{(1-x-y)}Al_yN$ ($0≦x$, $0≦y$, $x+y<1$) and a plurality of barrier layers each made of $In_aGa_{(1-a-t)}Al_tN$ ($0≦s$, $0≦t$, $s+t<1$), the multiple quantum well structure active layer being provided on the n-type layer; and growing a nitride semiconductor material an the multiple quantum well structure active layer to form a p-type layer. The step of growing the p-type layer includes the step of growing a nitride semiconductor material in an atmosphere not containing hydrogen gas while keeping a temperature of the substrate at a first growth temperature.

In one embodiment of this invention, the step of forming the p-type layer further includes the step of lowering the temperature of the substrate from the first growth temperature to about 400° C. In the atmosphere not containing hydrogen gas after the step of growing the nitride semiconductor material in the atmosphere not containing hydrogen gas.

Thus, the invention described herein makes possible the advantage of providing a semiconductor device having a long life.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

EXAMPLE 1

An exemplary light emitting diode (LED) according to Example 1 of the present invention will be described below.

Figure 1:
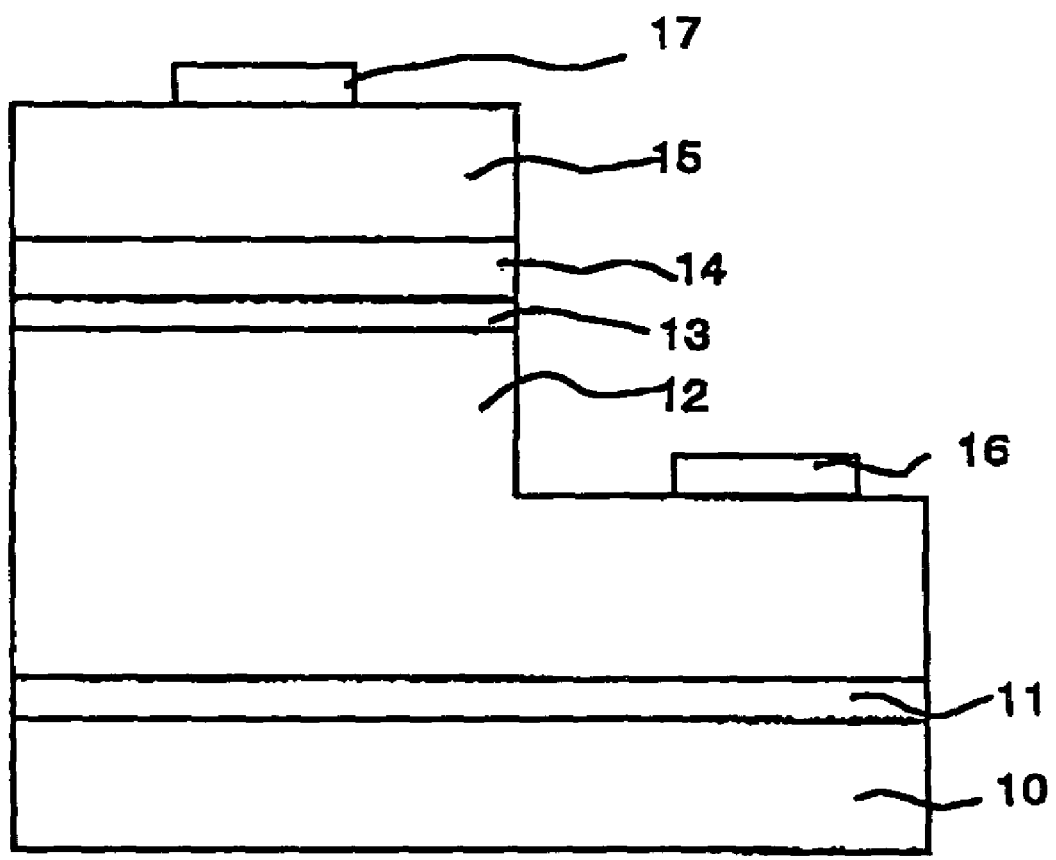
FIG. 1 is a cross-sectional view illustrating an LED device 1 according to Example 1 of the present invention.

FIG. 1 is a cross-sectional view illustrating an LED device 1 according to Example 1 of the present invention. The LED device 1 was produced using the following procedure.

On a sapphire substrate 10 (0001-plane), an AlN buffer layer 11 was grown at a substrate temperature of about 550° C., and an n-type GaN:Si contact layer 12 having a thickness of about 5 μm was grown at a substrate temperature of about 1100° C., both by atmospheric pressure MOCVD. The term "GaN:Si" herein means "GaN doped with Si". In this growth, the V/III ratio was about 2000. Up to this growth step, both the carrier gas and the bubbling gas for an organic metal were hydrogen gas.

Thereafter, the substrate temperature was lowered to about 760° C. The carrier gas and the bubbling is gas for the organic metal were changed to nitrogen gas. A multiple quantum well structure active layer 13 was grown under a condition where the oxygen partial pressure of gas inside a reaction furnace was about 0.7 Torr. In this case, the multiple quantum well structure active layer 13 is composed of five alternate layerings of an $In_{0.35}Ga_{0.65}N$:Si well layer (about 2 nm thick) and a GaN:Si barrier layer (about 4 nm thick). At substantially the same temperature, an $Al_{0.1}Ga_{0.9}N$:Mg anti-evaporation layer 14 having a thickness of 20 nm was grown. Thereafter, the substrate temperature was increased to about 1050° C, and a p-type Gan:Mg contact layer 15 having a thickness of about 0.3 μm was grown. Thus, the step of forming the p-type contact layer 15 (p-type layer) included growing a nitride semiconductor material in an atmosphere not containing hydrogen gas while keeping the substrate temperature at about 1050° C. (first growth temperature). Note that the carrier gas and the bubbling gas for an organic metal may be an inert gas of argon, helium, or the like, other than hydrogen.

After the above-described light emitting device structure had been provided on the sapphire substrate 10, the substrate temperature was lowered while the carrier gas was still nitrogen gas. Thus, after the production of the p-type contact layer 15, the temperature of the sapphire substrate 10 was lowered from about 1050° C. to about 400° C. In the atmosphere not containing hydrogen gas. However, the sapphire substrate 10 is not necessarily cooled to room temperature in the atmosphere not containing hydrogen gas. The atmosphere may contain hydrogen gas after the substrate temperature is lowered to about 400° C.

The wafer having the grown device structure was split into two pieces. One of the two pieces was subjected to a SHIMS measurement described later. The other piece was subjected to subsequent processes as follows. The other piece of the wafer was subjected to etching so that part of the n-type contact layer 12 was exposed. An n-type Au/Mo electrode 16 was formed on the exposed surface of the n-type contact layer 12. A p-type Au/Ni electrode 17 was formed on a surface of the p-type contact layer 15. Thus, completing the LED 1. The term "Au/Mo electrode" means that the electrode is composed of multiple layers of Au and Mo.

The LED device 1 emitted light having a wavelength of about 470 nm with a luminance of about 3 cd at a driving current of about 20 mA. In this case, an operating voltage was about 3.3 V. A driving current of about 20 mA was passed through the LED device 1 for about 1000 hours at room temperature. Substantially no change was found in the wavelength and luminance of light emitted by the LED device 1 and in the operating voltage of the LED device 1 after such a 1000-hour test. Thus, a long-life LED device is realized.

As shown in FIG. 1, the LED device 1 (semiconductor light emitting device) of the present invention includes: a sapphire substrate 10 (substrate); an n-type GaN:Si (nitride semiconductor) contact layer 12 (n-type layer) provided via a buffer layer 11 on the sapphire substrate 10; a multiple quantum well structure active layer 13 provided on the n-type contact layer; and a p-type GaN (nitride semiconductor) contact layer 15 (p-type layer) provided via the anti-evaporation layer 14 on the multiple quantum well structure active layer 13.

The Mg and hydrogen concentrations of the LED device 1 were measured by SHIMS (Secondary Ion Mass Spectrometry). Note that such a SHIMS measurement was conducted for the one piece of the split wafer.

Figure 2:
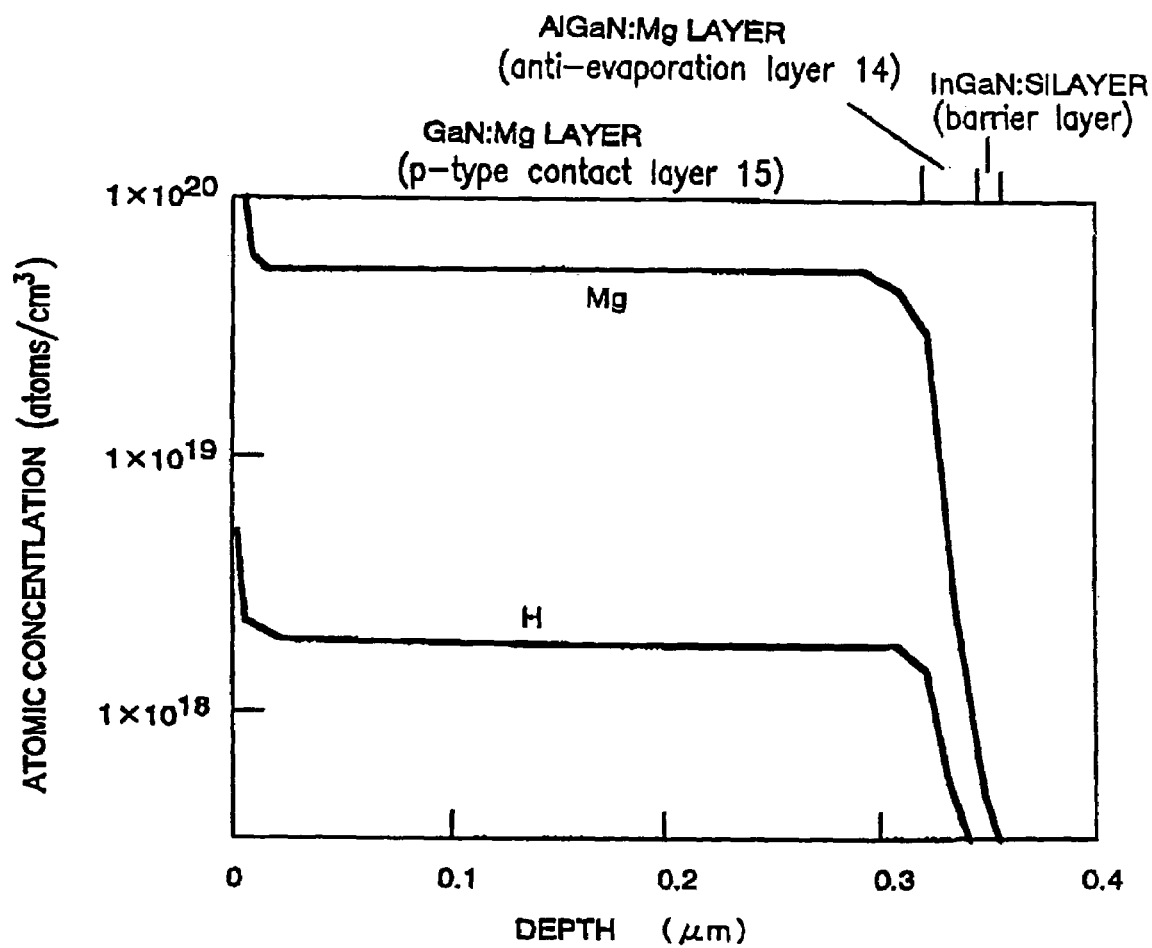
FIG. 2 is a graph showing the Mg and hydrogen concentrations of the LED device 1 measured using SHIMS.

FIG. 2 shows the Mg and hydrogen concentrations of the LED device 1 measured using the SHIMS. The Mg and hydrogen concentrations of the p-type contact layer 15 were about $7 \times 10^{19}$ atoms/cm$^3$ and about $2 \times 10^{16}$ atoms/cm$^3$, respectively. The hydrogen concentration of the n-type contact layer 12 was less than or equal to about $1 \times 10^{17}$ atoms/cm$^3$ which is the limit of detection. The hydrogen concentration of the p-type contact layer 15 is preferably greater than or equal to about $1 \times 10^{16}$ atoms/cm$^3$ and less than or equal to about $1 \times 10^{19}$ atoms/cm$^3$ in order to achieve a long-life LED device. Further, the Mg concentration of the p-type contact layer 15 is preferably greater than or equal to about $4 \times 10^{19}$ atoms/cm$^3$ and less than or equal to about $1 \times 10^{21}$ atoms/cm$^3$. A high Mg concentration of the p-type contact layer 15 leads to a high hydrogen concentration thereof, and therefore is not preferable.

In Example 1, the oxygen partial pressure of the gas inside the reaction furnace was about 0.7 Torr upon the growth of the p-type contact layer 15. As the amount of oxygen in the gas inside the reaction furnace was increased, the hydrogen concentration of the p-type contact layer 15 was decreased. It is believed that such a decrease is caused by the removal of hydrogen atoms (residual hydrogen atoms) in the p-type contact layer 15 due to the union of oxygen and hydrogen. Therefore, the hydrogen concentration of the p-type contact layer 15 can be controlled by adjusting the oxygen concentration of the gas inside the reaction furnace. It was found that if the oxygen partial pressure percentage of the total pressure of the gas inside the reaction furnace is greater than or equal to about 0.00001% (i.e., about $7.6 \times 10^{-5}$ Torr or more) and less than or equal to about 1% (7.6 Torr or less), the hydrogen concentration of the p-type contact layer 15 is less than or equal to $4 \times 10^{16}$ atoms/cm$^3$. Alternatively, in place of or in addition to adjusting the oxygen ($O_2$) concentration, the hydrogen concentration of the p-type contact layer 15 may be controlled by adjusting the concentration of at least one of bromine, chloride, ozone, CO, $CO_2$, NO and $NO_2$ in the gas inside the reaction furnace in combination with the concentration of oxygen.

As Comparative Example 1, an LED device was produced using the same growth procedure as described above except that the active layer 13 was composed of a single $In_{0.35}Ga_{0.65}N$:Si layer (about 20 nm thick). The LED device of Comparative Example 1 was measured using the SHIMS. As a result, the p-type contact layer of the LED device of Comparative Example 1 had an Mg concentration of about $7 \times 10^{16}$ atoms/cm$^3$ and a hydrogen concentration of about $2 \times 10^{18}$ atoms/cm$^3$, and a SHIMS profile similar to that shown in FIG. 2 was obtained. The LED device of Comparative Example 1 emitted light having a wavelength of about 470 nm with a luminance of about 1.5 cd at a driving current of about 20 mA. In this case, the operating voltage was about 3.3 V.

As Comparative Example 2, an LED device was produced where the same growth procedure as described above was used until the growth of the multiple quantum well structure active layer 13, and thereafter the carrier gas and the bubbling gas for an organic metal were changed to hydrogen gas, an $Al_{0.1}Ga_{0.9}N$:Mg anti-evaporation layer 14 having a thickness of about 20 nm and a p-type contact layer 15 having a thickness of about 0.3 μm were grown, and after growth of the complete device structure, the substrate temperature was lowered where the carrier gas was still hydrogen gas as conventional. If the device is not subjected to thermal annealing, the p-type contact layer 15 remains highly resistant. Therefore, the device of Comparative Example 2 was subjected to thermal annealing for about 20 minutes at about 800° C. In a nitrogen atmosphere so that the resistance of the p-type contact layer 15 was lowered.

After the thermal annealing, the LED device of Comparative Example 2 was measured using the SHIMS. As a result, the p-type contact layer 15 of the LED device of Comparative Example 2 had an Mg concentration of about $7 \times 10^{19}$ atoms/cm$^3$ and a hydrogen concentration of about $6 \times 10^{18}$ atoms/cm$^3$. The LED device of Comparative Example 2 emitted light having a wavelength of about 470 nm with a luminance of about 2.6 cd at a driving current of about 20 mA. In this case, the operating voltage was about 3.7 V.

Further, as Comparative Example 3, an LED device was produced using the same growth procedure as described in Comparative Example 2 except that the active layer 13 was composed of a single $In_{0.35}Ga_{0.65}N$:Si layer (about 20 nm thick). After the thermal annealing, the LED device of Comparative Example 3 was measured using the SHIMS. As a result, the p-type contact layer 15 of the LED device of Comparative Example 3 had an Mg concentration of about $7 \times 10^{19}$ atoms/cm$^3$ and a hydrogen concentration of about $6 \times 10^{18}$ atoms/cm$^3$. The LED device of Comparative Example 3 emitted light having a wavelength of about 470 nm with a luminance of about 1.2 cd at a driving current of about 20 mA. In this case, the operating voltage was about 3.7 V.

Figure 3:
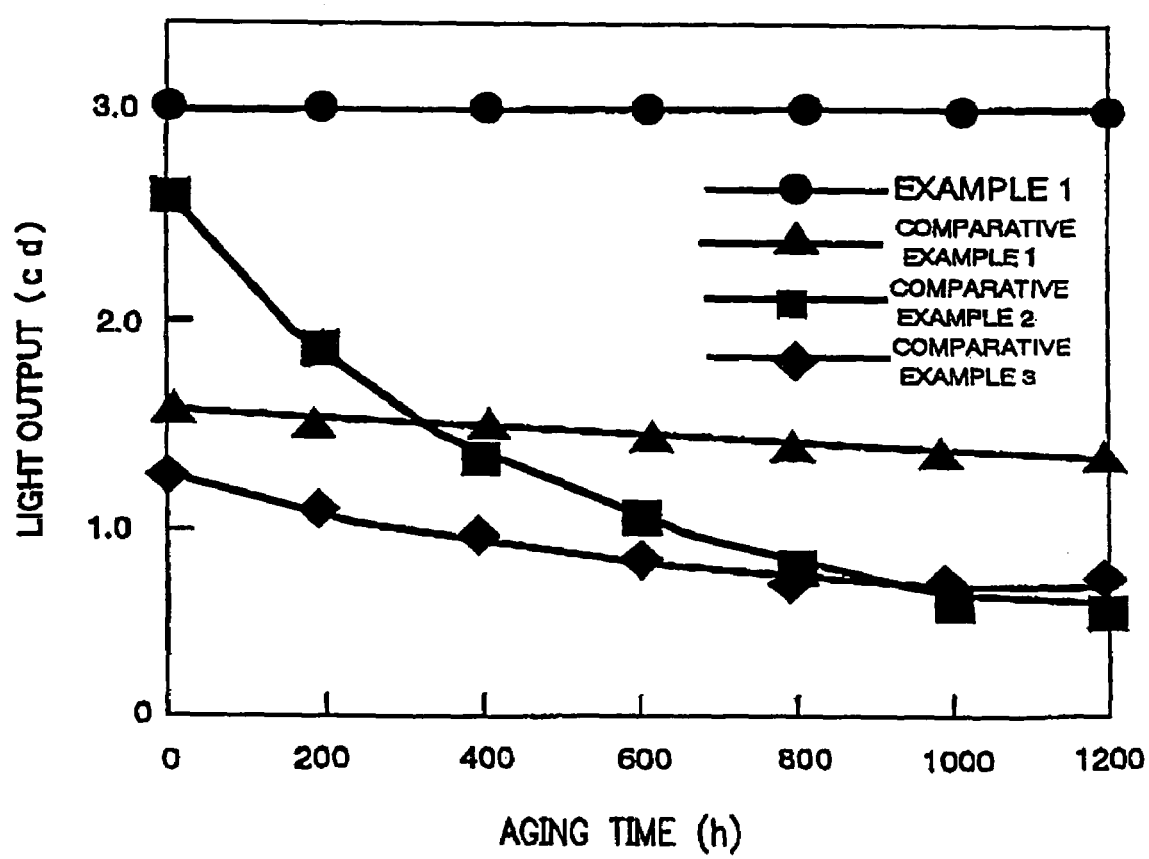
FIG. 3 is a graph showing a result of an aging test for the LED device 1 of Example 1 and LED devices of Comparative Examples 1 through 3.
Figure 4:
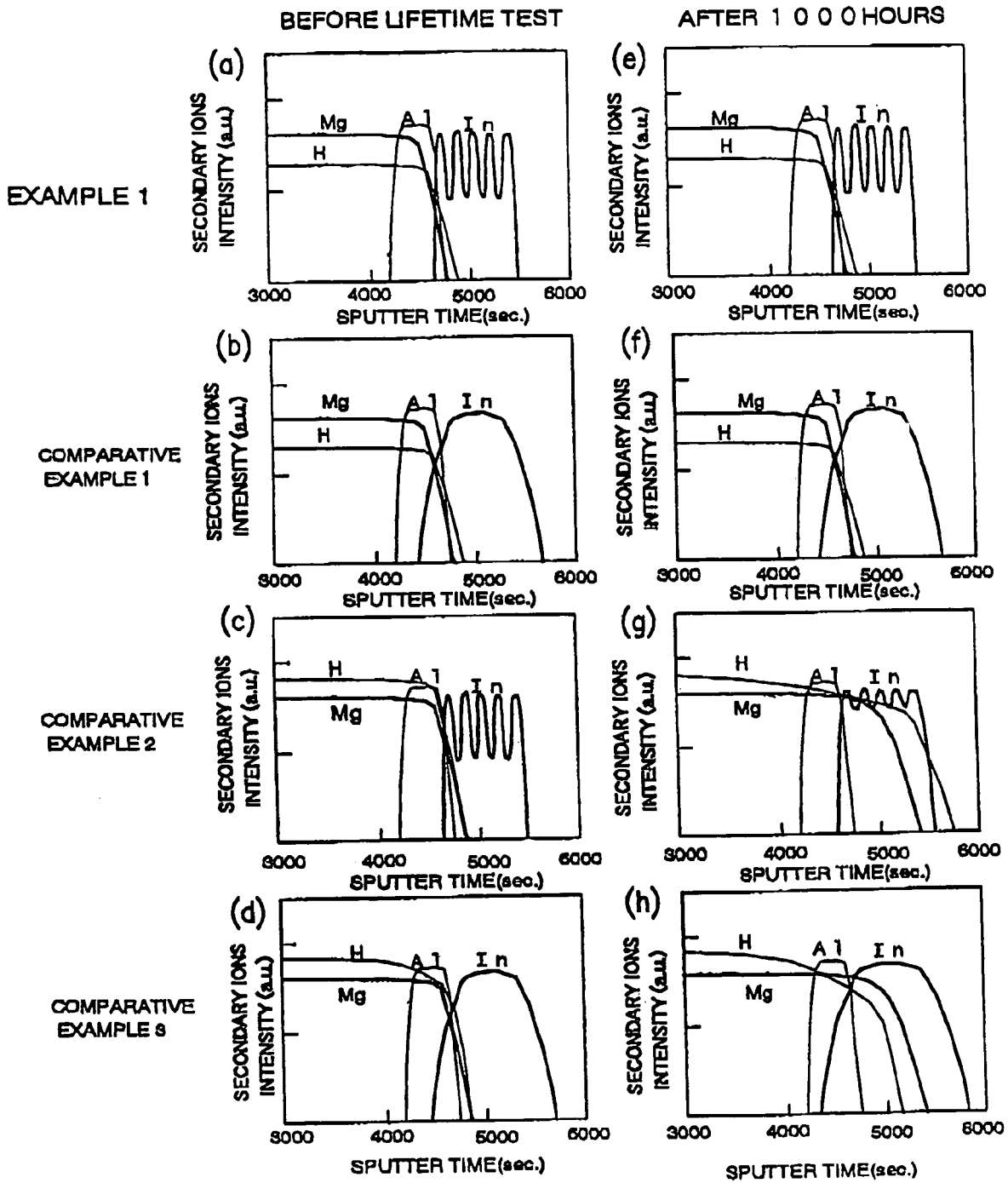
FIGS. 4(a) through 4(d) are graphs showing SHIMS profiles of the vicinity of the active layers of the LED devices of Example 1 and Comparative Example 1 through 3 before aging.
FIGS. 4(e) through 4(h) are graphs showing SHIMS profiles of the vicinity of the active layers of the LED devices of Example 1 and Comparative Example 1 through 3 after a 1000-hour aging test.

FIG. 3 shows a result of an aging test for the LED device 1 of Example 1 and the LED devices of Comparative Example 1 through 3. The luminance of the LED device of Comparative Example 2 was considerably lowered after 1000-hour aging. For the LED device of Comparative Example 1 having the single active layer the luminance was lowered after 1000-hour aging. In contrast, the luminance of the LED device 1 of Example 1 was not lowered after 1000-hour aging, i.e., the LED device 1 has a long life. Comparing Example 1 with Comparative Example 1, the life elongation effect of an LED device due to a reduction in the hydrogen concentration of the p-type contact layer 15 was great when the LED device had a multiple quantum well structure active layer.

FIGS. 4(a) through 4(d) show SHIMS profiles of the vicinity of the active layers of the LED devices of Example 1 and Comparative Example 1 through 3 before aging. FIGS. 4(e) through 4(h) show SHIMS profiles of the vicinity of the active layers of the LED devices of Example 1 and Comparative Example 1 through 3 after 1000-hour aging. In each of FIGS. 4(a), 4(c), 4(e) and 4(g), the peaks of In concentration correspond to the well layers of the multiple quantum well structure active layer, and the valleys of In concentration correspond to the barrier layers of the multiple quantum well structure active layer. As can be seen from FIGS. 4(c) and 4(g), in the LED device of Comparative Example 2, In atoms in the well layers of the multiple quantum well structure active layer were diffused into the barrier layers. As can be seen from FIGS. 4(a) and 4(e), the diffusion phenomenon of the In atoms of the well layers into the barrier layers did not occur in the LED device 1 of Example 1.

Figure 5:
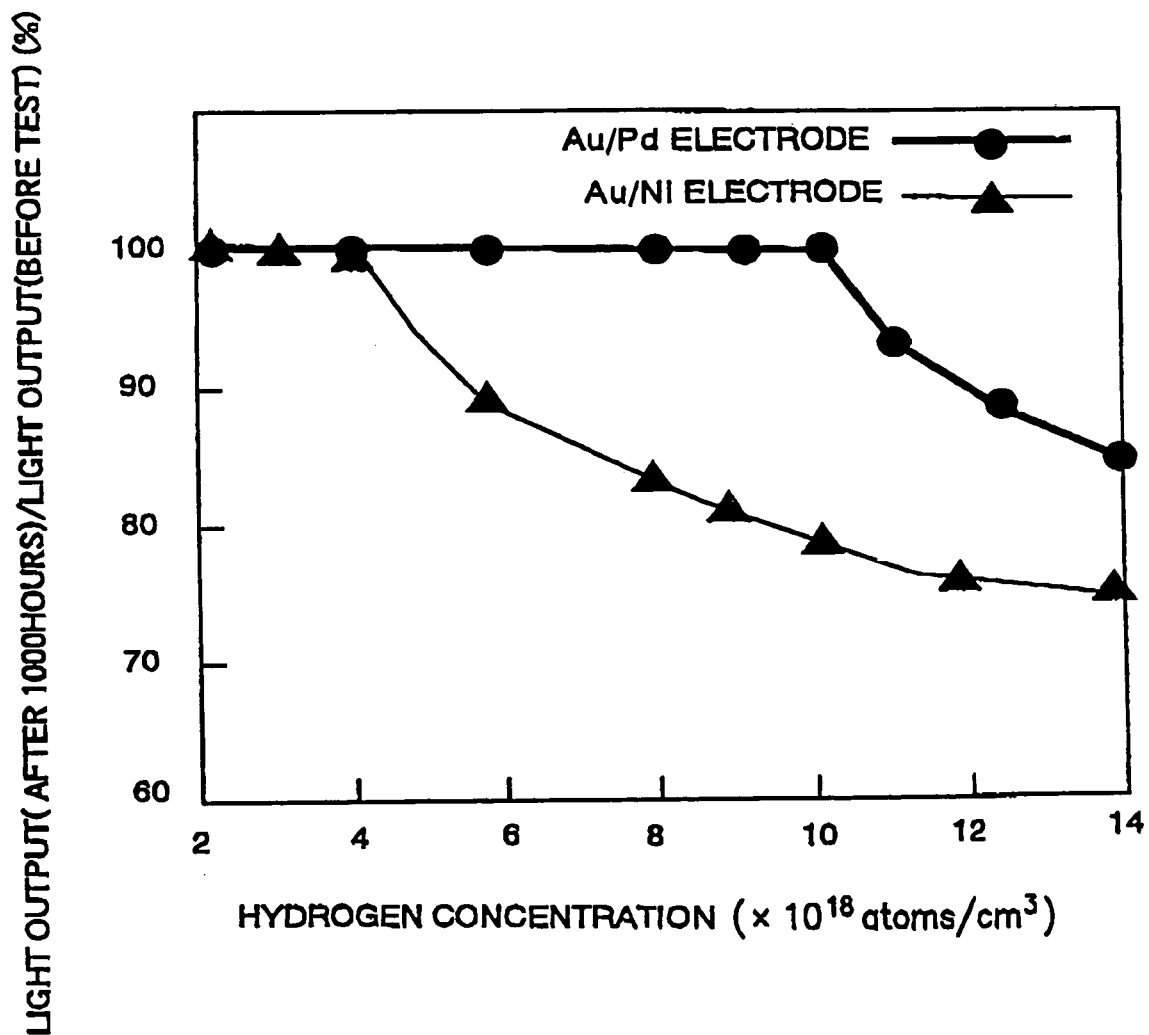
FIG. 5 is a graph showing the relative luminance of LED devices after a 1000-hour aging test with respect to the hydrogen concentration of a p-type contact layer 15 of FIG. 1.

FIG. 5 shows the relative luminance of the LED devices after 1000-hour aging with respect to the hydrogen concentration of the p-type contact layer 15. The relative luminance is represented by a relative value where the luminance at the initial period of the aging test is regarded as 100. In each of the LED devices, the n-type electrode 16 was made of Au/Mo, and the p-type electrode 17 was made of Au/Pd or Au/Ni. As can be seen from FIG. 5, when the p-type electrode 17 was made of Au/Pd, if the hydrogen concentration of the p-type contact layer 15 was less than or equal to about $1 \times 10^{19}$ atoms/cm$^3$, the luminance of the LED devices was not lowered even after 1000-hour aging. Further, when the p-type electrode 17 was made of Au/Ni, If the hydrogen concentration of the p-type contact layer 15 was less than or equal to about $4 \times 10^{18}$ atoms/cm$^3$, the luminance of the LED devices was not lowered even after 1000-hour aging.

As described above, the p-type electrode 17 is preferably made of Au/Pd. This is because Pd s a hydrogen storage metal. Specifically, hydrogen atoms (residual hydrogen atoms) in the p-type contact layer 15 are absorbed by the p-type electrode 17, thereby preventing the residual hydrogen atoms from being diffused into the multiple quantum well structure active layer 13. Examples of known hydrogen storage metals include Pd, Sc, Y, La, Ce, Pr, Nd, Sm, Eu, Tb, Ti, Zr, Hf, V, Nb and Ta. That is, if the p-type electrode 17 includes a hydrogen storage metal, the p-type electrode 17 can absorb the residual hydrogen atoms. The p-type electrode 17 may have a multi-layer structure including a hydrogen storage metal. Alternatively, the p-type electrode 17 may be made of an intermetallic compound including a hydrogen storage metal.

For the purpose of evaluating the influence of the hydrogen concentration of the n-type contact layer on the life of an LED device, the LED device of the present invention was produced in the following way. An AlN buffer layer 11 and an n-type GaN:Si contact layer 12 were grown on a sapphire substrate 10 (0001-plane) where the oxygen partial pressure of the gas inside the reaction furnace was about 10 Torr (the hydrogen concentration was about 1.3%). Thereafter, the carrier gas and the bubbling gas for an organic metal were changed to nitrogen gas, and the residual oxygen partial pressure of the gas inside the furnace was set to about 0.7 Torr (the residual oxygen concentration was about 0.1%), followed by the remaining production steps as above. Thus, completing the LED device. The LED device was measured using the SHIMS. As a result, the Mg and hydrogen concentrations of the p-type contact layer 15 were about $7 \times 10^{19}$ atoms/cm$^3$ and about $2 \times 10^{16}$ atoms/cm$^3$. The hydrogen concentration of the n-type contact layer 12 was about $3 \times 10^{17}$ atoms/cm$^3$. The initial characteristics of the LED device were as follows the wavelength of emitted light was about 470 nm; the luminance was about 2.7 cd, and the operating voltage was about 4.1 V, at a driving current of about 20 mA. The characteristics of the LED device after 1000-hour aging were as follows: the wavelength of emitted light was about 470 nm; the luminance was about 2.4 cd and the operating voltage was about 4.5 V, at a driving current of about 20 mA. Thus, a decrease in luminance and an increase in operating voltage were found In the LED device after 1000-hour aging. Note that an increase in operating voltage means an increase in device resistance, since the driving current was fixed at about 20 mA.

LED devices, each of which has a p-type layer grown under the same conditions as described above and an n-type contact layer 12 including a different concentration of hydrogen, were produced. When the n-type contact layer 12 has a hydrogen concentration of about $10 \times 10^{17}$ atoms/cm$^3$ or more, the operating voltage of the LED device was increased immediately after the start of aging, and an increase in operating voltage and a decrease in luminance were found in the LED device after 1000-hour aging. Therefore, the hydrogen concentration of the n-type contact layer 12 (the n-type layer) is preferably about $10 \times 10^{17}$ atoms/cm$^3$ or less in order to realize a long-life LED device.

As shown in FIG. 1, the p-type contact layer 15 of the LED device 1 is provided via the anti-evaporation layer 14 on the multiple quantum well structure active layer 13. The anti-evaporation layer 14 includes Al atoms. The Al atoms prevent the residual hydrogen atoms in the p-type contact layer 15 from being diffused into the multiple quantum well structure active layer 13, i.e., the Al atoms prevent deterioration of the multiple quantum well structure active layer 13. Note that the thickness of the anti-evaporation layer 14 (a layer including Al) is preferably about 5 nm or more in order to sufficiently obtain such an effect.

The composition of a well layer is not limited to $In_{0.35}Ga_{0.65}N$, and may include Al. A typical composition of the well layer is represented by $In_xGa_{(1-x-y)}Al_yN$ (where $0 \leq x$, $0 \leq y$, x+y<1). The composition of a barrier layer is not limited to GaN. A typical composition of the barrier layer is represented by $In_aGa_{(1-a-t)}Al_tN$ (where $0 \leq s$, $0 \leq t$, s+t<1).

The substrate to not limited to sapphire (0001, i.e., C-plane). Alternatively, A-plane or M-plane sapphire may be employed. The substrate may be made of GaN, Sic, Si or ZnO. The crystal growth method is not limited to MOCVD. When the LED device of the present invention was produced by MBE, the LED device had a luminance profile similar to that as shown in FIG. 3.

Thus, according to the present invention, an LED device having a residual hydrogen concentration which is appropriately controlled is achieved, without dependence on the crystal growth method used, and a long-life LED is realized.

EXAMPLE 2

An exemplary light emitting diode (LED) according to Example 2 of the present invention will be described below. The LED device includes a GaN substrate.

Figure 6:
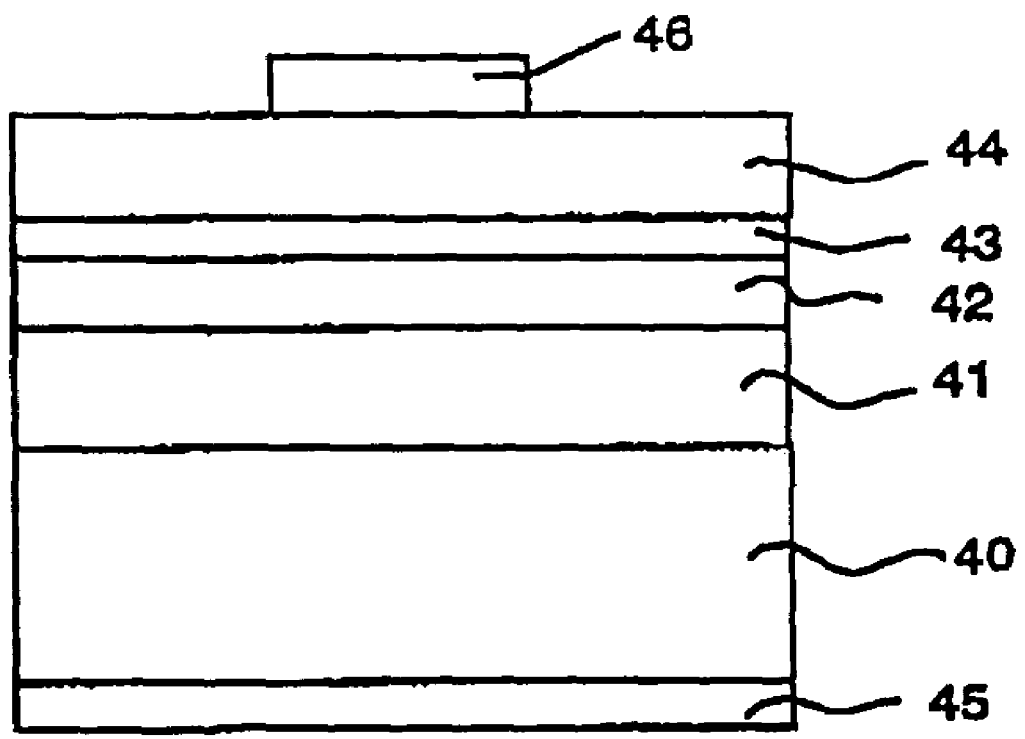
FIG. 6 to a cross-sectional view illustrating an LED device 601 according to Example 2 of the present invention.

FIG. 6 is a cross-sectional view illustrating an LED device 601 according to Example 2 of the present invention. The LED device 601 was produced using the following procedure.

A film of GaN:Si having a thickness of about 300 μm was grown on a sapphire substrate (0001-plane) using HVPE. Thereafter, the sapphire substrate was removed by polishing to obtain a GaN (0001-plane) substrate 40. An n-type GaN:Si contact layer 41 having a thickness of about 1 μm was grown at a substrate temperature of about 1100° C. by atmospheric pressure MOCVD. Up to this growth step, both the carrier gas and the bubbling gas for an organic metal were hydrogen gas.

Thereafter, the substrate temperature was lowered to about 760° C. The carrier gas and the bubbling gas for an organic metal were changed to nitrogen gas. A multiple quantum well structure active layer 42 was grown. In this case, the multiple quantum well structure active layer 42 is compound of four alternate layerings of an $In_{0.35}Ga_{0.65}N$:Si (about 2 nm thick) and a GaN:Si barrier layer (about 4 nm thick). An $Al_{0.1}Ga_{0.9}N$:Mg anti-evaporation layer 43 having a thickness of 20 nm was grown at a temperature of about 1000° C. Thereafter, the substrate temperature was increased to about 1050° C., and a p-type GaN:Mg contact layer 44 having a thickness of about 0.3 μm was grown. After the above-described light emitting device structure had been provided on the GaN substrate 40, the substrate temperature was lowered while the carrier gas was still nitrogen gas, where the substrate temperature drop rate was net to about 10° C./min.

An n-type Ti/Al electrode 45 was formed on a bottom surface of the GaN (GaN:Si) substrate 40 and a p-type Au/Pd electrode 46 was formed on a top surface of the p-type contact layer 44.

The thus-constructed LED device 601 emitted light having a wavelength of about 470 nm with a luminance of about 3.3 cd at a driving current of about 20 mA. In this case, the operating voltage was about 3.1 V.

The LED device 601 was subjected to a 1000-hour aging test at room temperature where a driving current was about 20 mA. As a result, there was substantially no change in the wavelength of emitted light, luminance and operating voltage even after 1000-hour aging.

The Mg and hydrogen concentrations of the LED device 601 were measured using the SHIMS. As a result, the Mg and hydrogen concentrations of the p-type contact layer 44 were about $9\times10^{19}$ atoms/cm$^3$ and about $3\times10^{16}$ atoms/cm$^3$, respectively. The hydrogen concentration of the n-type contact layer 41 was less than or equal to about $1\times10^{17}$ atoms/cm$^3$ which is the limit of detection. When the Mg concentration of the p-type contact layer 44 was about $9\times10^{19}$ atoms/cm$^3$, if the substrate temperature drop rate after the crystal growth was less than or equal to about 25° C./min, the hydrogen concentration of the p-type contact layer 44 was less than or equal to about $4\times10^{16}$ atoms/cm$^3$. Such SHIMS measurement was conducted using a wafer before the n-type electrode 45 and the p-type electrode 46 were formed.

For the purpose of evaluating the influence of the thickness of the active layer 42, on the life of an LED device, a variety of the LED devices of the present invention were produced where the thickness of one wall layer in the active layer 42 is in the range of from about 1 to about 50 nm.

An LED device of Comparative Example 1 was produced in the following way. After the growth of the active layer 42, the carrier gas and the bubbling gas for an organic metal were changed to hydrogen gas. An $Al_{0.1}Ga_{0.9}N$:Mg anti-evaporation layer 43 and a p-type contact layer 44 having a thickness of about 0.3 μm were successively grown. After growing a complete device structure, the substrate temperature was lowered where the carrier gas was still hydrogen gas, as in a conventional method. A variety of the LED devices of the Comparative Example 1 were produced where the thickness of one well layer in the active layer 42 is in the range of from about 1 to about 50 nm.

Figure 7:
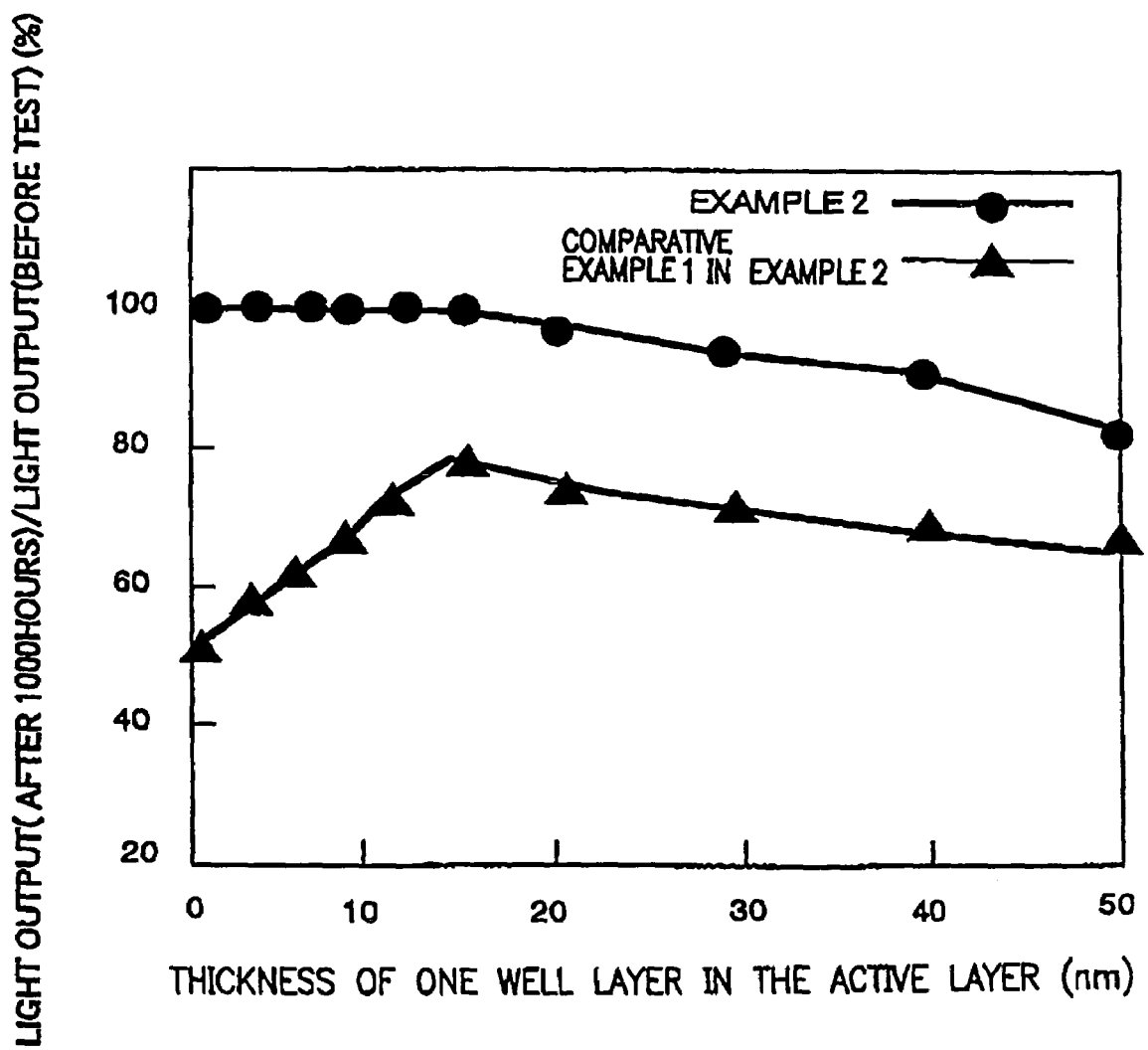
FIG. 7 is a graph showing the relative luminance of LED devices after a 1000-hour aging test with respect to the thickness of one well layer in an active layer 42 of FIG. 2.

FIG. 7 shows the relative luminance of the LED devices of the Comparative Example 1 after 1000-hour aging with respect to the thickness of one well layer in the active layer 42. The relative luminance is represented by a relative value where the luminance at the initial period of the aging test is regarded as 100. As can be seen from FIG. 7, when the thickness of one well layer in the active layer 42 was less than or equal to about 15 nm, the LED device of Comparative Example 1 was considerably deteriorated. The SHIMS analysis revealed that such deterioration was due to the diffusion of hydrogen and Mg atoms. In contrast, diffusion of In, hydrogen and Mg were not substantially found in the. LED device 601 of Example 2. On the other hand, for the devices of both Example 2 and Comparative Example 1, when the thickness of one well layer in the active layer 42 was greater than or equal to about 15 nm, the luminance was lowered after the 1000-hour aging. The reason is that the increased thickness of one well layer in the active layer 42 leads to lattice relaxation in the InGaN active layer, thereby deteriorating the crystallinity of the active layer.

EXAMPLE 3

An exemplary laser diode (OLD) according to Example 3 of the present invention will be described below.

Figure 8:
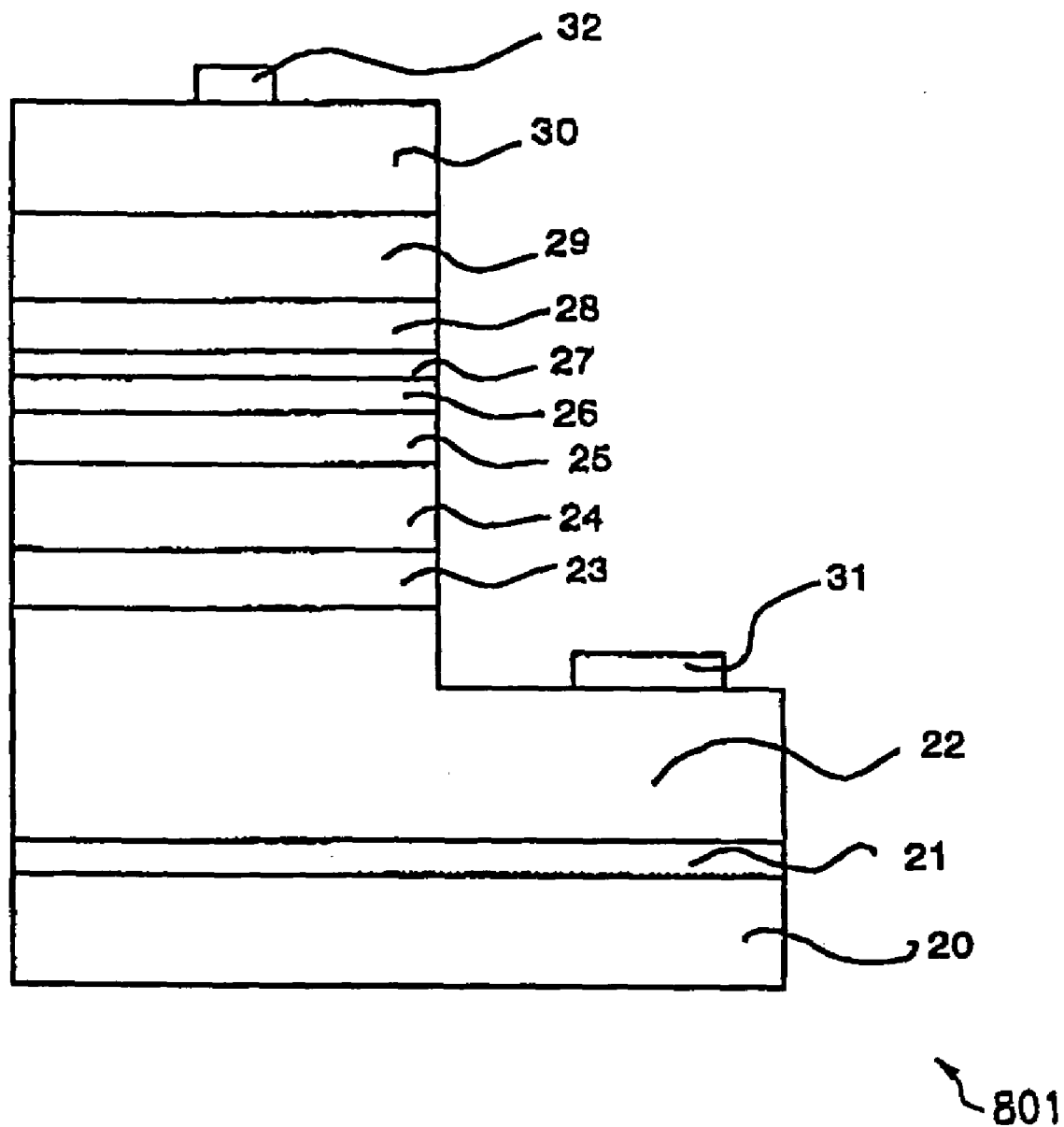
FIG. 8 is a cross-sectional view illustrating an OLD device 801 according to Example 3 of the present invention.

FIG. 8 is a cross-sectional view illustrating an OLD device 801 according to Example 3 of the present invention. The OLD device 801 was produced using the following procedure.

On a sapphire substrate 20 (0001-plane), a GaN buffer layer 21 was grown at a substrate temperature of about 550° C., and an n-type GaN:Si contact layer 22 having a thickness of about 4 μm was grown at a substrate temperature of about 1100° C., by low pressure MOCVD of about 76 Torr. Thereafter, an $In_{0.05}Ga_{0.95}N$:Si anti-crack layer 23 having a thickness of about 50 nm was grown at a substrate temperature of about 800° C. Thereafter, the substrate temperature was increased to about 1100° C. again, and an n-type $Al_{0.1}Ga_{0.9}N$:Si cladding layer 24 having a thickness of about 0.5 μm and an n-type GaN:Si guide layer 25 having a thickness of about 0.1 μm were successively grown. Up to the growth step, both the carrier gas and the bubbling gas for an organic metal were hydrogen gas.

Thereafter, the substrate temperature was lowered to about 760° C., and the carrier gas and the bubbling gas for an organic metal were changed to nitrogen gas. An $In_{0.05}Ga_{0.95}N$:Si layer having a thickness of about 4 nm was grown under a condition where the oxygen ($O_2$) partial pressure of the gas inside the reaction furnace was about 0.2 Torr (the oxygen concentration was about 0.3%). Thereafter, a multiple quantum well structure active layer 26 composed of five alternate layerings of an $In_{0.15}Ga_{0.85}N$:Si well layer (about 2 nm thick) and an $In_{0.05}Ga_{0.95}N$:Si barrier layer (about 4 nm thick) was grown. At substantially the same temperature, an $Al_{0.1}Ga_{0.9}N$:Mg anti-evaporation layer 27 having a thickness of about 10 nm was grown.

Thereafter, a p-type GaN:Mg guide layer 28 having a thickness of about 0.1 μm, a p-type $Al_{0.1}Ga_{0.9}N$:Mg cladding layer 29 having a thickness of about 0.5 μm, and a p-type GaN:Mg contact layer 30 having a thickness of about 0.3 μm were grown at a substrate temperature of about 1100° C. where the carrier gas and the bubbling gas for an organic metal were still nitrogen gas. Thus, the step of forming the p-type layer (including the p-type GaN:Mg guide layer 28, the p-type $Al_{0.1}Ga_{0.9}N$:Mg cladding layer 29, and the p-type GaN:Mg contact layer 30) included growing a nitride semiconductor material in an atmosphere not containing hydrogen gas at a low pressure of about 76 Torr while keeping the substrate temperature at about 1100° C. (first growth temperature). Note that the carrier gas and the bubbling gas for the organic metal may be an inert gas of argon, helium, or the like, other than hydrogen.

After the above-described light emitting device structure had been provided on the sapphire substrate 20, the substrate temperature was lowered without introduction of hydrogen gas into the reaction furnace Thus, after the production of the p-type layer (including the p-type Gan:Mg guide layer 28, the p-type $Al_{0.1}Ga_{0.9}N$:Mg cladding layer 29, and the p-type GaN:Mg contact layer 30), the temperature of the sapphire substrate 20 was lowered from about 1100° C. to room temperature in an atmosphere not containing hydrogen gas at a low pressure of about 76 Torr. However, the sapphire substrate 20 was not necessarily cooled to room temperature in the atmosphere not containing hydrogen gas at a low pressure of about 76 Torr. The ambience may contain hydrogen gas after the substrate temperature is lowered to about 4000° C.

The wafer having the grown device structure was split into two pieces. One piece of the wafer was subjected to etching so that part of the n-type contact layer 22 was exposed where the exposed region was in the form of a strip having a width of about 200 μm. A p-type Au/Pd electrode 32 was formed in the form of a strip having a thickness of about 2 μcm on a surface of the p-type contact layer 30. An n-type Ti/Al electrode 31 was formed on a surface of the n-type contact layer 22.

The OLD device 801 performed CW oscillation (continuous wave operation) at room temperature where a threshold current was about 25 mA and a threshold voltage was about 5.1 V.

As shown in FIG. 8, the OLD device 801 (semiconductor light emitting device) of the present invention includes: a sapphire substrate 20 (substrate); an n-type layer (including the n-type contact layer 22, the n-type cladding layer 24 and the n-type guide layer 25) made of a semiconductor material and successively provided via a buffer layer 21 on the sapphire substrate 20; a multiple quantum well structure active layer 26 provided on the n-type layer: and a p-type layer (including the p-type guide layer 28, the p-type cladding layer 29 and the p-type contact layer 30) made of a semiconductor material and successively provided via the anti-evaporation layer 27 on the multiple quantum well structure active layer 26.

Although the OLD element 801 of FIG. 8 includes the anti-crack layer 23, such a structure is not essential for laser oscillation. In Example 4 described later, an OLD device not including an anti-crack layer will be described.

The hydrogen and Mg concentrations of the OLD device 801 were measured using the SHIMS. Note that such a SHIMS measurement was conducted for the other piece of the split wafer.

All layers of the p-type layer, i.e, the p-type guide layer 28, the p-type cladding layer 29 and the p-type contact layer 30, each have a hydrogen concentration of about $3\times10^{16}$ atoms/cm$^3$ and a Mg concentration of about $9\times10^{19}$ atoms/cm$^3$.

By the same principle as described in Example 1, the hydrogen concentration of the p-type layer can be controlled by adjusting the oxygen concentration of the gas inside the reaction furnace upon formation of the p-type layer. Alternatively, in place of or in addition to adjusting only the oxygen concentration, the hydrogen concentration of the p-type layer may be controlled by adjusting the concentration of at least one of bromine, chloride, ozone, CO, $CO_2$, NO and $NO_2$ in the gas inside the reaction furnace in combination with the concentration of oxygen. In Example 3, the $O_2$ concentration of the gas inside the reaction furnace was about 0.3%. It was found that if the oxygen partial pressure percentage of the total pressure of the gas inside the reaction furnace is greater than or equal to about 0.00001% and less than or equal to about 1%, the hydrogen concentration of the p-type layer (including the p-type guide layer 28, the p-type cladding layer 29 and the p-type contact layer 30) is less than or equal to $4\times10^{16}$ atoms/cm$^3$.

As Comparative Example 1, an OLD device was produced using the same growth procedure as described above except that the p-type layer (including the p-type guide layer 28, the p-type cladding layer 29 and the p-type contact layer 30) was grown where the carrier gas was hydrogen, and the resultant structure was subjected to annealing for about 20 minutes at about 800° C. in an atmosphere having a nitrogen concentration of about 100%. The LD device of Comparative Example 1 was found to perform CW oscillation at room temperature where a threshold current was about 30 mA and a threshold voltage was about 5.7 V. Note that the hydrogen concentration of the p-type layer in the LD device of Comparative Example 1 after the annealing was measured using the SIMS and the result was about $2\times10^{19}$ atoms/cm$^3$.

An LD device of Comparative Example 2 was produced. The LD of Comparative Example 2 had the same structure aB that of the LD device 801 of Example 3 except that the p-type layer (including the p-type guide layer 28, the p-type cladding layer 29 and the p-type contact layer 30) had a hydrogen concentration of less than or equal to about $8\times10^{15}$ atoms/cm$^3$ which is the limit of detection. The LD device of Comparative Example 2 was produced using the same procedure as that for the LD device of Example 3. The LD device of Comparative Example 2 performed CW oscillation at room temperature where a threshold current was about 30 mA and a threshold voltage was about 6.9 V. Thus, the LD device of Comparative Example 2 had a threshold voltage higher than that of the LD device 801 of Example 3 and that of the LD device of Comparative Example 1.

Further, an LD device was produced in which the active layer 26 was composed of a single $In_{0.15}Ga_{0.85}N$:Mg layer (about 2 nm thick). Such an LD device did not generate laser oscillation when the carrier gas was hydrogen as well as when the carrier gas was nitrogen.

The LD devices of Example 3 and Comparative Example 1 and 2 were subjected to an aging test.

Figure 9:
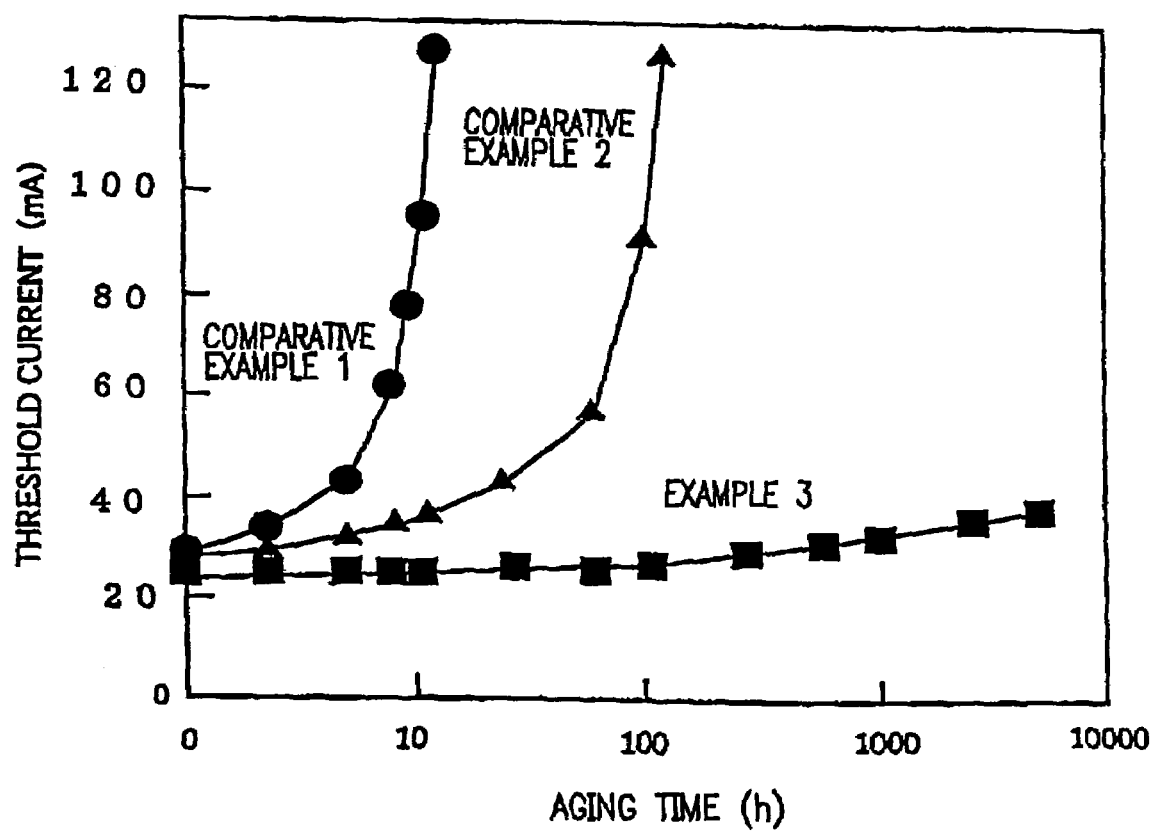
FIG. 9 is a graph showing a variation in a threshold current with respect to aging time.

FIG. 9 shows a variation in a threshold current with respect to aging time. An Increase in threshold current means deterioration of an LD device. It was found that the LD device 801 could perform CW oscillation after 8000- hour aging. The LD device of Comparative Example 1 including the p-type layer having a hydrogen concentration of about $2 \times 10^{19}$ atoms/cm$^3$ was deteriorated after 10-hour aging. The LD device of Comparative Example 2 including the p-type layer having a hydrogen concentration of about $8 \times 10^{15}$ atoms/cm$^3$ or less was deteriorated after 150-hour aging. Thus, the LD device 801 of Example 3 is a long life LD device (semiconductor light emitting device).

Figure 10:
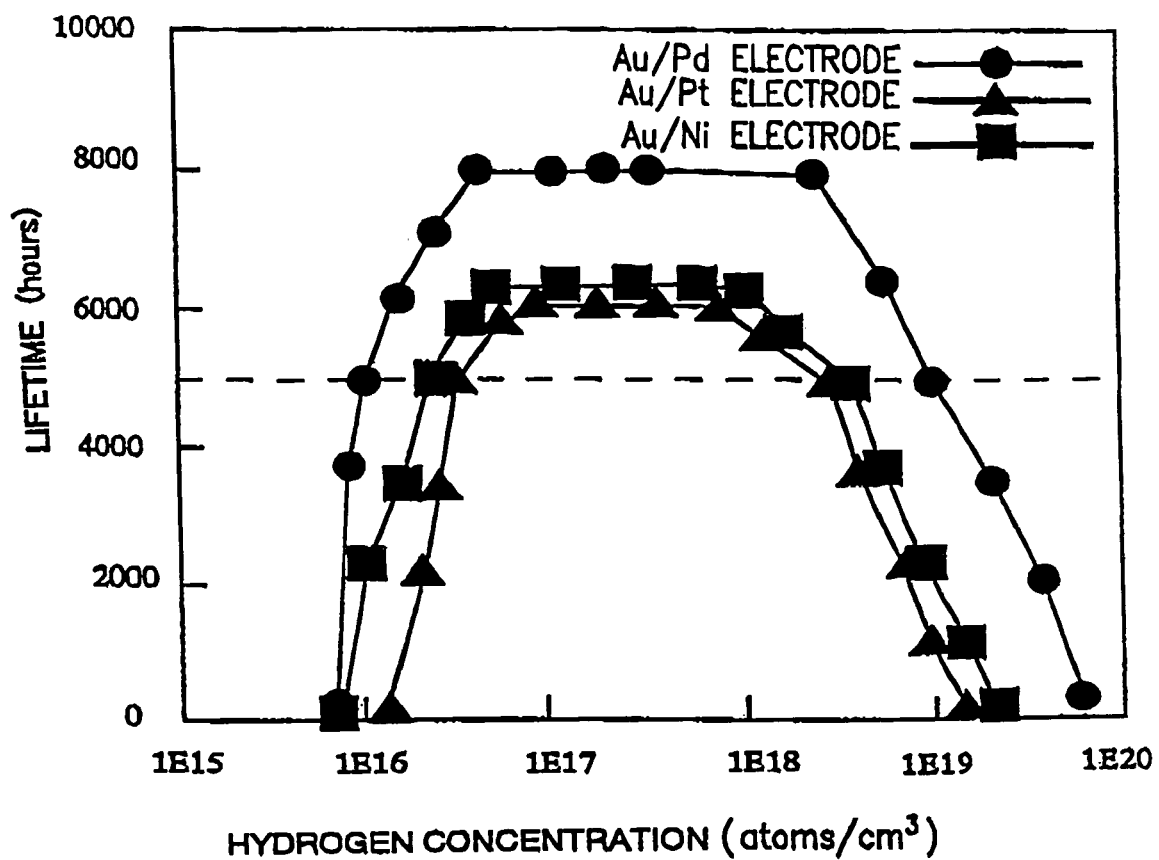
FIG. 10 is a graph showing the life of the OLD device 801 with respect to the hydrogen concentration of a p-type contact layer 30 of FIG. 8.

FIG. 1. shows the life of the LD device 801 with respect to the hydrogen concentration of the p-type contact layer 30. The p-type electrode 32 was made of Au/Pd, Au/Pt or Au/Ni. The n-type electrode 31 was made of Ti/Al. In FIG. 10, an LD device which was not deteriorated after 8000-hour aging is represented by an LD device having a life of 8000 hours. This is because at least 8000 hours had passed after the start of aging at the time of the measurement shown in FIG. 10. An LD device having a life of about 5000 hours or more is regarded as a non-defective product. In FIG. 10, a life of 5000 hours is represented by a broken line.

As can be seen from FIG. 10, the material for the p-type electrode 32 has a great influence on the life of the LD device. When Au/Pd is used as the material for the p-type electrode 32, if the hydrogen concentration of the p-type contact layer 30 is greater than or equal to about $1 \times 10^{16}$ atoms/cm$^3$ and less than or equal to about $1 \times 10^{19}$ atoms/cm$^3$, an LD device having a life of 5000 hours or more can be obtained. When Au/Ni is used as the material for the p-type electrode 32, if the hydrogen concentration of the p-type contact layer 30 is greater than or equal to about $3 \times 10^{16}$ atoms/cm$^3$ and less than or equal to about $6 \times 10^{18}$ atoms/cm$^3$, an LD device having a life of 5000 hours or more can be obtained. When Au/Pt is used as the material for the p-type electrode 32, if the hydrogen concentration of the p-type contact layer 30 is greater than or equal to about $4 \times 10^{16}$ atoms/cm$^3$ and less than or equal to about $5 \times 10^{18}$ atoms/cm$^3$, an LD device having a life of 5000 hours or more can be obtained. In the LD devices subjected to the aging test described with reference to FIG. 10, the range of hydrogen concentration of the p-type cladding layer 29 was greater than or equal to about $8 \times 10^{15}$ atoms/cm$^3$ and less than or equal to about $3 \times 10^{19}$ atoms/cm$^3$ which is the same range as In the p-type contact layer 30.

As can be seen from FIG. 10, the hydrogen concentration of the p-type layer is preferably greater than or equal to about $1 \times 10^{16}$ atoms/cm$^3$ and less than or equal to about $1 \times 10^{19}$ atoms/cm$^3$ In order to realize a long-life LD device. The Mg concentration of the p-type layer is preferably greater than or equal to about $4 \times 10^{19}$ atoms/cm$^3$ and less than or equal to about $1 \times 10^{21}$ atoms/cm$^3$. As the Mg concentration of the p-type layer increases, the hydrogen concentration of the p-type layer also Increases, which is not preferable. It is believed that the reason the life of the LD device is reduced when the hydrogen concentration is lower than the above-described preferable range, is that the p-type layer having an extremely low hydrogen concentration is highly resistant and therefore an operating voltage is increased.

Note that it is not essential that the three layers included in the p-type layer (i.e., the p-type GaN:Mg guide layer. 28, the p-type $Al_{0.1}Ga_{0.9}N$:Mg cladding layer 29, and the p-type Gan:Mg contact layer 30) have the same hydrogen concentration. If the three layers have a hydrogen concentration in a preferable range, a long-life semiconductor light emitting device is achieved.

As can be seen from FIG. 10, the p-type electrode 32 is preferably made of Au/Pd. This is due to the same principle as described above in terms of the p-type electrode 17 in Example 1. Specifically, if the p-type electrode 32 includes a hydrogen storage metal, the p-type electrode 32 can absorb the residual hydrogen atoms. The p-type electrode 32 may have a multi-layer structure including a hydrogen storage metal. Alternatively, the p-type electrode 32 may be made of an intermetallic compound including a hydrogen storage metal.

Further, the life of an LD device was evaluated with respect to the hydrogen concentration of the p-type cladding layer 29. The resultant profile is similar to that shown in FIG. 10. When Au/Pd is used as the material for the p-type electrode 32, if the hydrogen concentration of the p-type cladding layer 29 is greater than or equal to about $1 \times 10^{16}$ atoms/cm$^3$ and less than or equal to about $1 \times 10^{19}$ atoms/cm$^3$, an LD device having a life of 5000 hours or more can be obtained. When Au/Ni is used as the material for the p-type electrode 32, if the hydrogen concentration of the p-type cladding layer 29 is greater than or equal to about $3 \times 10^{16}$ atoms/cm$^3$ and less than or equal to about $6 \times 10^{16}$ atoms/cm$^3$ an LD device having a life of 5000 hours or more can be obtained. When Au/Pt is used as the material for the p-type electrode 32, if the hydrogen concentration of the p-type cladding layer 29 is greater than or equal to about $4 \times 10^{16}$ atoms/cm$^3$ and less than or equal to about $5 \times 10^{18}$ atoms/cm$^3$, an LD device having a life of 5000 hours or more can be obtained.

The hydrogen concentration of the n-type layer (including the n-type contact layer 22, the n-type cladding layer 24 and the n-type guide layer 25) has an influence on the life of the LD device 801. The hydrogen concentration of the n-type layer is preferably less than or equal to about $1 \times 10^{17}$ atoms/cm$^3$.

As shown in FIG. 8, the p-type layer of the LD device 801 is provided via the anti-evaporation layer 27 on the multiple quantum well structure active layer 26. The anti-evaporation layer Z7 includes Al atoms. The Al atoms prevent the residual hydrogen atoms in the p-type layer from being diffused into the multiple quantum well structure active layer 26. i.e., the Al atoms prevent deterioration of the multiple quantum well structure active layer 26. Note that the thickness of the anti-evaporation layer 27 (including Al) is preferably about 5 nm or more in order to sufficiently obtain such an effect.

The composition of a well layer is not limited to $In_{0.15}Ga_{0.85}N$:Mg and the well layer may include Al. A typical composition of the well layer is represented by $In_xGa_{(1-x-y)}Al_yN$ (where $0 \leq x$, $0 \leq y$, x+y<1). The composition of a barrier layer is not limited to $In_{0.05}Ga_{0.95}N$. A typical composition of the barrier layer is represented by $In_xGa_{(1-x-y)}Al_yN$ (where $0 \leq s$, $0 \leq t$, s+t<1)

In the LD device 801 of Example 3, the cladding layers (i.e., the n-type cladding layer 24 and the p-type cladding layer 29) are made of $Al_{0.1}Ga_{0.9}N$. The molar ratio of Al is not limited to 0.1. The cladding layers may be made of a mixed crystal AlGaInN, or alternatively, a super-lattice structure, such as AlGaN/GaN, AlGaN/AlGaN, AlGaInN/AlGaInN, or AlGaInN/GaN. Similar to the anti-evaporation layer 27 containing Al, the p-type cladding layer 29. containing Al can prevent the residual hydrogen atoms in the p-type contact layer 30 from being diffused into the multiple quantum well structure active layer 26. Further, the n-type cladding layer 24 containing Al can prevent the residual hydrogen atoms in the n-type contact layer 22 from being diffused into the multiple quantum well structure active layer 26.

Figure 11:
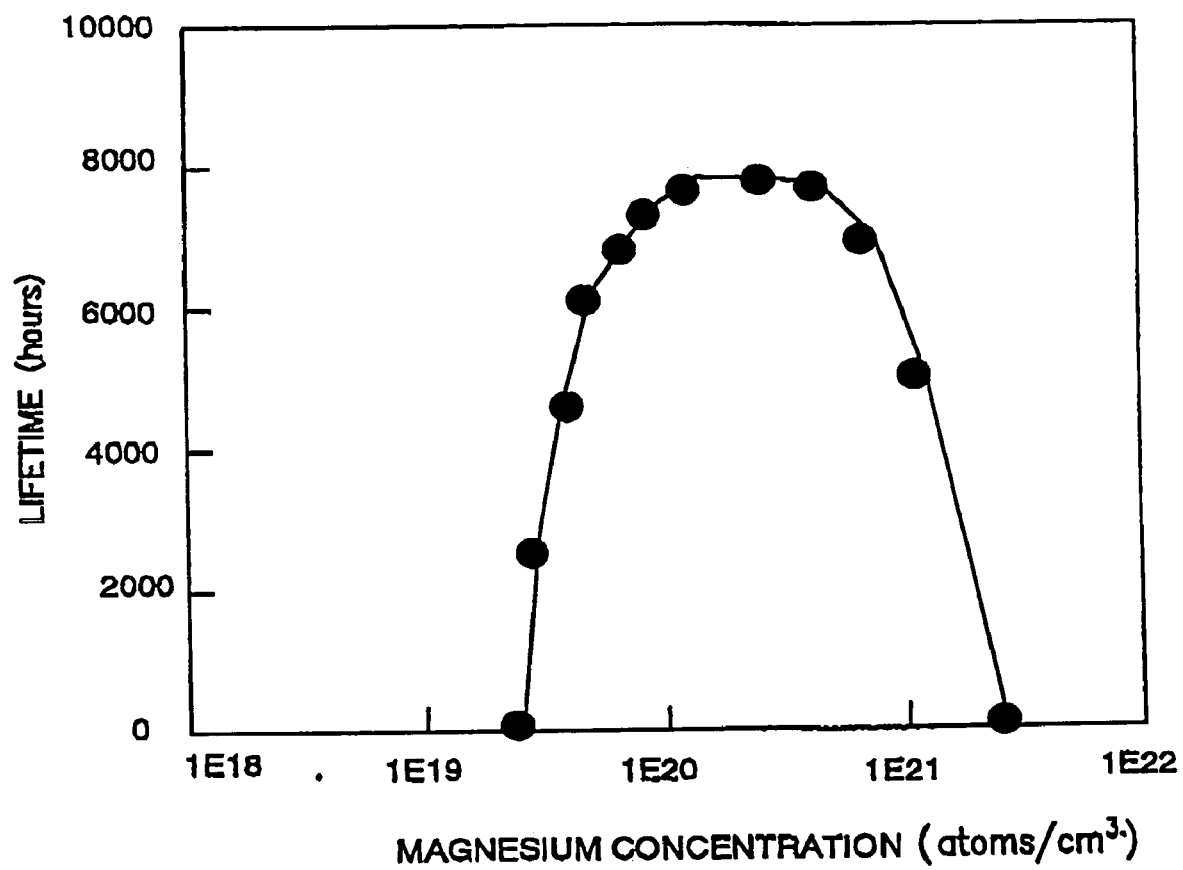
FIG. 11 is a graph showing the life of the OLD device 801 with respect to the Mg concentration of a p-type layer.

FIG. 11 shows the life of the LD device 801 with respect to the Mg concentration of the p-type layer. The S p-type electrode 32 was made of Au/Pd. If the Mg concentration of the p-type layer is greater than or equal to about $2\times10^{19}$ atoms/cm$^3$ and less than or equal to about $2\times10^{21}$ atoms/cm$^3$, the hydrogen concentration of the p-type layer is greater than or equal to about $1\times10^{16}$ atoms/cm$^3$ and less than or equal to about $3\times10^{19}$ atoms/cm$^3$. As can be seen from FIG. 11, if the Mg concentration of the p-type layer is greater than or equal to about $4\times10^{19}$ atoms/cm$^3$ and less than or equal to about $1\times10^{21}$ atoms/cm$^3$, an LD device having a life of 5000 hours or more can-be obtained.

EXAMPLE 4

An exemplary LD device according to Example 4 of the present invention will be described below. The LD device includes a GaN substrate.

Figure 12:
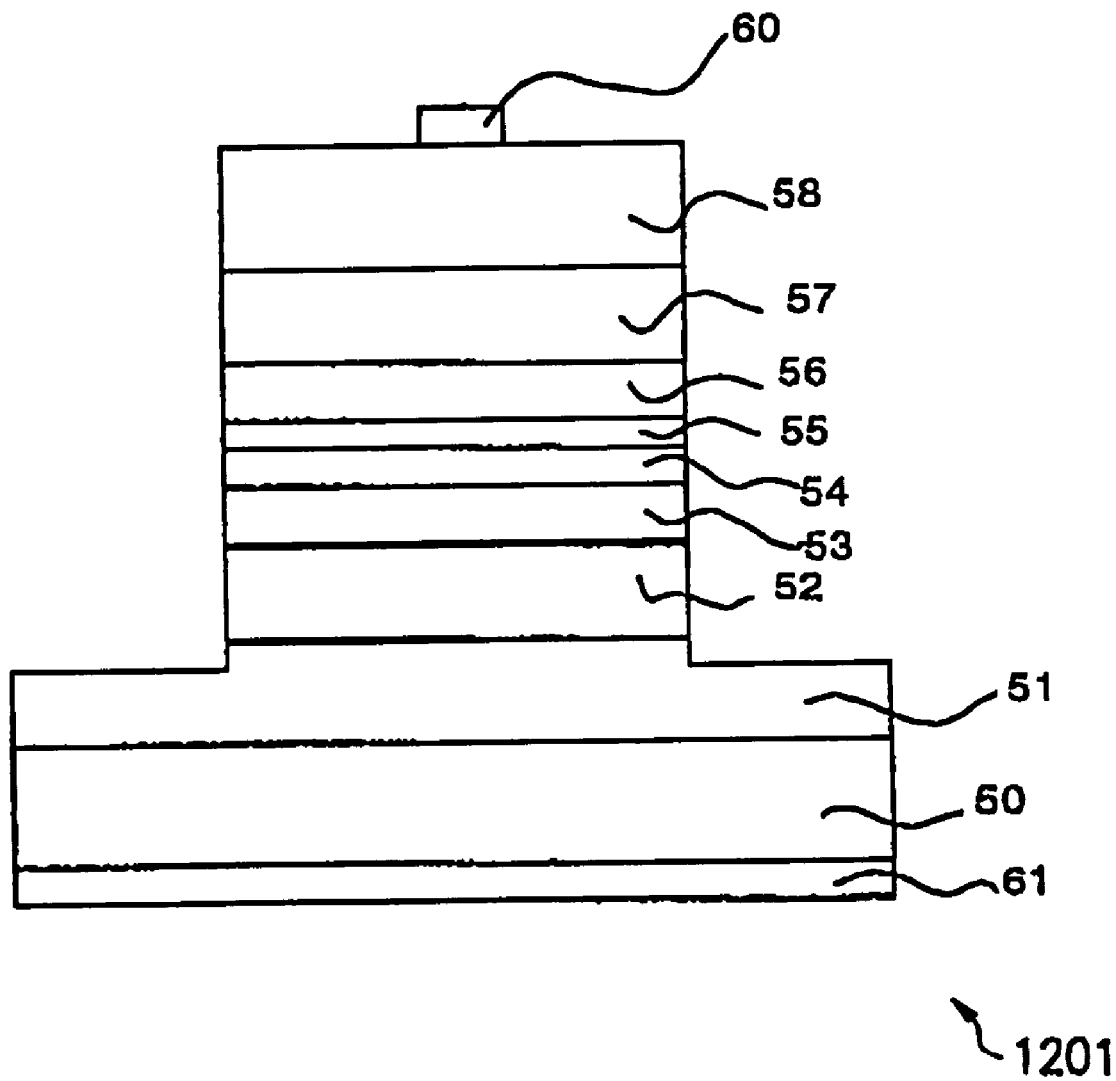
FIG. 12 is a cross-sectional view illustrating an OLD device 1201 according to Example 4 of the present invention.

FIG. 12 is a cross-sectional view illustrating an LD device 1201 according to Example 4 of the present invention. The LD device 1201 was produced using the following procedure.

A film of GaN:Si having a thickness of about 300 µm was grown on a sapphire substrate (0001-plane) using HVPE. Thereafter, the sapphire substrate was removed by polishing to obtain a GaN (0001-plane) substrate 50. An n-type GaN:Si contact layer 51 having a thickness of about 0.8 µm and an n-type Al$_{0.1}$Ga$_{0.9}$N:Si cladding layer 52 having a thickness of about 0.5 µm was successively grown at a substrate temperature of about 1100° C. An n-type GaN:Si guide layer 53 having a thickness of about 0.1 µm was grown. Up to this growth step, both the carrier gas and the bubbling gas for an organic metal were hydrogen gas.

Thereafter, the carrier gas and the bubbling gas for an organic metal were changed to nitrogen gas, and the substrate temperature was lowered to about 750° C. A multiple quantum well structure active layer 54 was grown. In this case, the multiple quantum well structure active layer 54 is composed of three alternate layerings of an In$_{0.15}$Ga$_{0.85}$N:Si well layer (about 2 nm thick) and an In$_{0.05}$Ga$_{0.95}$N:Si barrier layer (about 4 nm thick). An Al$_{0.1}$Ga$_{0.9}$N:Mg anti-evaporation layer 55 having a thickness of 10 nm was grown at the same temperature.

Thereafter, a p-type GaN:Mg guide layer 56 having a thickness of about 0.1 µm, a p-type Al$_{0.1}$Ga$_{0.9}$N:Mg cladding layer 57 having a thickness of about 0.5 µm, and a p-type GaN:Mg contact layer 58 having a thickness of about 0.3 µm were successively grown at a substrate temperature of about 1050° C. where the carrier gas and the bubbling gas for an organic metal were still nitrogen gas. In this case, the oxygen concentration of the gas inside the reaction furnace was about 0.08%.

Thereafter, the wafer having the grown device structure was subjected to etching so that part of the n-type contact layer 51 was exposed where the exposed region was in the form of a strip having a width of about 200 µm. A p-type Au/Pd electrode 60 was formed in the form of a strip having a thickness of about 5 µm on a surface of the p-type contact layer 58. An n-type Ti/Al electrode 61 was formed on a bottom surface of the n-type GaN:Si substrate 50.

The thus-constructed LD device 1201 performed CW oscillation at room temperature where a threshold current was about 20 mA and a threshold voltage was about 5.0 V. The LD device was subjected to aging at room temperature where a driving current was about 35 mA. As a result, there was substantially no change in threshold current and threshold voltage even after 1000-hour aging. Thereby, a long-life LD device is achieved.

As described above, the present invention provides a long-life semiconductor light emitting device (an LED device or an LD device), without dependence on the materials used for the substrate and the crystal growth methods.

According to the present invention, the hydrogen concentration of the p-type layer in a semiconductor light is emitting device is greater than or equal to about $1\times10^{16}$ atoms/cm$^3$ and less than or equal to about $1\times10^{19}$ atoms/cm$^3$.

Thereby, hydrogen atoms in the p-type layer are prevented from being diffused into a multiple quantum well structure active layer, thereby suppressing deterioration of the multiple quantum well structure active layer. Therefore. a long-life semiconductor light emitting device is achieved.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for producing a semiconductor light emitting device, the method comprising the steps of:
   growing a nitride semiconductor material on a substrate to form an n-type layer;
   forming a multiple quantum well structure active layer including a plurality of well layers each made of In$_x$Ga$_{(1-x-y)}$Al$_y$N ($0\leq x$, $0\leq y$, $x+y<1$) and a plurality of barrier layers each made of In$_a$Ga$_{(1-s-t)}$Al$_t$N ($0\leq s$, $0\leq t$, $s+t<1$), the multiple quantum well structure active layer being provided on the n-type layer; and
   growing a nitride semiconductor material on the multiple quantum well structure active layer to form a p-type layer,
   wherein the step of growing the p-type layer includes the step of growing a nitride semiconductor material in an atmosphere not containing hydrogen gas while keeping a temperature of the substrate at a first growth temperature.

2. A method according to claim 1, wherein the step of forming the p-type layer further includes the step of lowering the temperature of the substrate from the first growth temperature to about 400° C. In the atmosphere not containing hydrogen gas after the step of growing the nitride semiconductor material in the atmosphere not containing hydrogen gas.

* * * * *